(12) United States Patent
Takahashi

(10) Patent No.: US 8,125,283 B2
(45) Date of Patent: Feb. 28, 2012

(54) METHOD OF MANUFACTURING CRYSTAL ELEMENT AND CRYSTAL RESONATOR MANUFACTURED THEREBY

(75) Inventor: Takehiro Takahashi, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 50 days.

(21) Appl. No.: 12/803,062

(22) Filed: Jun. 18, 2010

(65) Prior Publication Data

US 2010/0327987 A1    Dec. 30, 2010

(30) Foreign Application Priority Data

Jun. 29, 2009  (JP) ................................ 2009-153904

(51) Int. Cl.
H01L 41/00    (2006.01)
H03B 5/32    (2006.01)

(52) U.S. Cl. .................... 331/158; 310/320; 310/367

(58) Field of Classification Search .................. 331/158; 310/320, 321, 367, 368
See application file for complete search history.

(56) References Cited

U.S. PATENT DOCUMENTS

2004/0174092 A1* 9/2004 Iwata ............................ 310/324

FOREIGN PATENT DOCUMENTS

| JP | 2001-102654 | 4/2001 |
| JP | 2003-060461 | 2/2003 |
| JP | 2003-110388 | 4/2003 |
| JP | 2004-165743 | 6/2004 |
| JP | 2005-184665 | 7/2005 |
| JP | 2008-187321 | 8/2008 |

* cited by examiner

Primary Examiner — David Mis
(74) Attorney, Agent, or Firm — Scott D. Wofsy; Edwards Wildman Palmer LLP

(57) ABSTRACT

A crystal element manufacturing method for manufacturing a plurality of crystal elements at a wafer level and a crystal resonator is provided. The method provides that when the frequencies of the crystal elements are adjusted by adjusting the thickness of a crystal wafer that constitutes the crystal element in two stages by partial wet etching, the thicknesses of a large number of the step sections are coarse-adjusted in a first stage by collectively subjecting the step sections to partial wet etching, and then variations in the thicknesses of each group of a small number of the step sections are fine-adjusted in a second stage by collectively subjecting the step sections to partial wet etching.

10 Claims, 4 Drawing Sheets

METHOD OF MANUFACTURING CRYSTAL ELEMENT AND CRYSTAL RESONATOR MANUFACTURED THEREBY

BACKGROUND OF THE INVENTION

1. Technical Field

The present invention relates to a crystal element manufacturing method in which a crystal element is manufactured while the frequency of the crystal element is maintained at a predetermined precision and is efficiently adjusted by means of wet etching, in particular, by means of partial etching at a wafer level (wafer method), and a crystal resonator manufactured by this method.

2. Background Art

In recent years, crystal resonators, which have superior frequency stability with no variation with respect to a reference frequency, have been widely used as a reference source of frequency and time in electronic devices including many types of communication devices.

This type of a crystal resonator is formed from a crystal wafer or the like that is cut out from an artificial crystal by, for example, an AT cut (generally a cut out at an angle of approximately 35° 15' with respect to the Z axis), and is then formed by means of mechanical polishing and wet etching or dry etching so that the crystal element maintains its thickness according to a desired frequency.

In general, in an AT cut crystal element, thickness-shear vibration is applied to the vibration mode thereof, and the vibration frequency thereof is in reverse proportion to the thickness of the crystal element, with the vibration frequency becoming higher as the thickness of the crystal element becomes smaller.

Incidentally, in recent years, highly notable development is being made in achieving higher frequencies of crystal resonators, and the thickness of a crystal element is increasingly being minimized due to this achievement of higher frequency. Consequently, a high level of processing precision and a high level of productivity are required in order to maintain the thickness of a crystal element at an appropriate thickness in manufacturing. If the processing precision does not meet a certain standard, then a problem will occur in the frequency adjustment of the crystal element, and productivity of the manufacturing will be reduced.

For example, in a crystal resonator manufacturing method disclosed in Patent Document 1 (Japanese Unexamined Patent Publication No. 2001-102654), first, as shown in FIG. 4 and FIG. 5, a crystal wafer 1 is prepared, and a large number (for example, 1,000 or more) of so-called reverse mesa sections respectively having a step section 2a, a partition 2b, and a bottom section 2c, which will become crystal element formation sections, are formed, by means of wet etching or the like, only on the front surface 2 among the front surface 2 and back surface 3 of the crystal wafer 1.

The crystal wafer 1 having a large number of the reverse mesa sections formed thereon in this way, is mounted on a crystal resonator manufacturing apparatus as shown in FIG. 6, to thereby adjust the frequency thereof. That is to say, with the step sections 2a formed on the crystal wafer 1 facing upward, prior to wet etching, partition plates 10 are bonded and fixed in a standing condition on the front surface 2 of the crystal wafer 1 with use of an adhesive agent or the like, in order to prevent etchant from flowing into the adjacent step sections 2a. Then, etchant 16 is dropped in a sequential manner into the respective step sections 2a from a nozzle (syringe) 15a of a dispenser 15 via through holes 11 provided in the partition plates 10 to thereby perform etching, and then neutralizing liquid or the like is dropped into the step sections 2a from a separately provided dispenser (not shown in the drawing) to thereby stop progression of the wet etching.

Next, the frequency of a vibrating section (crystal element formation section) formed within the step section 2a is measured using a separately provided frequency measuring apparatus, and is compared with a reference frequency, and if a deviation is present, the thickness of the vibrating section (step section 2a) will be reduced according to the deviation to thereby make an adjustment to achieve the desired frequency.

However, in such a conventional method of adjusting the frequency of a crystal resonator, the etchant 16 is individually dropped into each of, for example, 1,000 or more step sections (crystal element formation sections) formed on a crystal wafer to make frequency adjustments, and it is absolutely necessary to suppress variation in frequency of each crystal element in order to stabilize the frequency characteristics of the crystal elements. Consequently, frequency adjustment is performed for each crystal element in two stages of adjustment, namely coarse adjustment [for example, up to 200 ppm of reference (target) frequency] and fine adjustment [for example, up to 50 ppm of target frequency].

PROBLEMS TO BE SOLVED BY THE INVENTION

However, in the crystal resonator manufacturing method disclosed in the aforementioned Patent Document 1, the frequency adjustment is performed for each of the 1,000 or more step sections (crystal element formation sections) formed on a crystal wafer, and it is also performed for each of the step sections by means of wet etching in two separate stages, namely coarse adjustment and fine adjustment. Consequently, the amount of operation time (tact) increases in the wet etching step, in particular, in the partial etching step, resulting in reduced productivity of the entire manufacturing steps, and also variation still occurs in the frequency of each crystal element with respect to the target frequency.

SUMMARY OF THE INVENTION

Therefore, the present invention has been achieved in order to solve the above problems that are seen in the conventional crystal resonator manufacturing method. An object of the present invention is to provide a crystal element manufacturing method and a crystal resonator manufactured by this method, in which: step sections (reverse mesa sections) having different sizes (area) are formed on both of front and back surfaces of a crystal wafer; a coarse frequency adjustment is performed for each crystal element by means of wet etching; a partial wet etching is performed on each of the step sections on the front surface or back surface of the crystal wafer, or a large number or a small number of these step sections collectively undergo a partial wet etching, to adjust the frequency; and thereby the tact (amount of operation time) required in the partial wet etching is significantly improved.

MEANS FOR SOLVING THE PROBLEMS

In order to solve the above problems, the crystal element manufacturing method of the present invention is a method of manufacturing a plurality of crystal elements at a crystal wafer level, comprising when the frequencies of the crystal elements are adjusted by adjusting the thickness of a crystal wafer that constitutes the crystal element in two stages by partial wet etching, the thicknesses of a large number of the step sections are coarse-adjusted in a first stage by collectively subjecting the step sections to partial wet etching, and then the thicknesses of each group of a small number of the step sections having a substantially equal thickness are fine-adjusted in a second stage by collectively subjecting the step sections to partial wet etching.

Moreover, similarly, the crystal element manufacturing method of the present invention is a method of manufacturing a plurality of crystal elements at a crystal wafer level, comprising when the frequencies of the crystal elements are adjusted by adjusting the thickness of a crystal wafer that constitutes the crystal element in two stages by partial wet etching, variations in the thicknesses of the step sections, which are to be simultaneously fine-adjusted in the first stage, are coarse-adjusted by performing partial wet etching to thereby achieve a substantially equal thickness, and then the thicknesses of a group of a large number of the step sections having substantially equal thicknesses are fine-adjusted by collectively subjecting the step sections to partial wet etching.

Furthermore, the present invention is comprising the area of the step sections that are formed on the back surface of the crystal wafer by means of wet etching, is greater than the area of the opposite step sections that are formed on the front surface (an area equivalent to the combined areas of the plurality of step sections that are formed on the front surface).

EFFECT OF THE INVENTION

Step sections having different areas are formed on the front and back surfaces of a crystal wafer, a plurality of the respective step sections collectively undergo partial wet etching, and then predetermined step sections individually undergo partial wet etching, thereby significantly reducing the tact (the amount of operation time) required for performing partial wet etching.

BRIEF DESCRIPTION OF THE DRAWINGS

FIG. 1 includes schematic drawings showing a large number of step sections having been formed on the front and back surfaces of a crystal wafer to be processed in a crystal element manufacturing method of the present invention, wherein

DETAILED DESCRIPTION OF PREFERRED EMBODIMENT

Figure 1A:
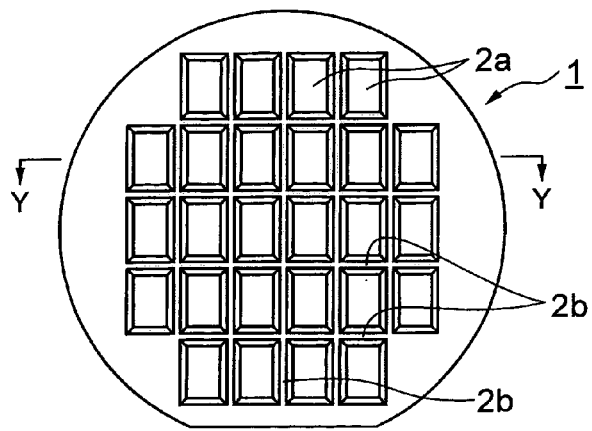
FIG. 1A is a plan view of the front surface of the crystal wafer.
Figure 1B:
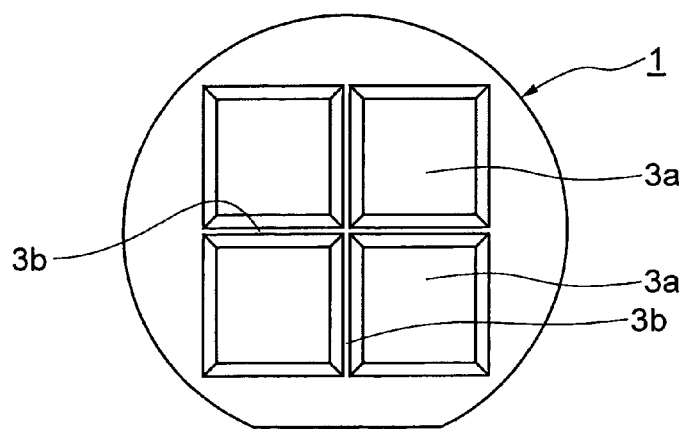
FIG. 1B is a plan view of the back surface of the crystal wafer.

FIG. 1A is a plan view of the front surface of a crystal wafer for manufacturing individual crystal elements of the present invention, and FIG. 1B is a schematic plan view of the back surface of the crystal wafer. The configuration is for example, such that 1,000 or more of 1 mm×1 mm square-shaped crystal elements can be manufactured from a crystal wafer of 4 inch diameter. FIG. 1 shows a circular crystal wafer 1 having a flat edge section, however a non-circular (for example, square-shaped) crystal wafer or the like may be used. Moreover, FIG. 2 is cross-sectional view of the crystal wafer 1 shown in FIG. 1A, taken along the arrows Y-Y.

Figure 2:
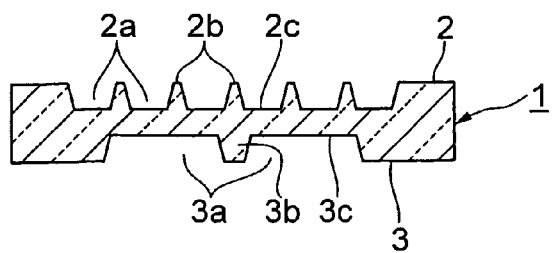
FIG. 2 is cross-sectional view of the crystal wafer shown in FIG. 1A, taken along the arrows Y-Y.
Figure 3:
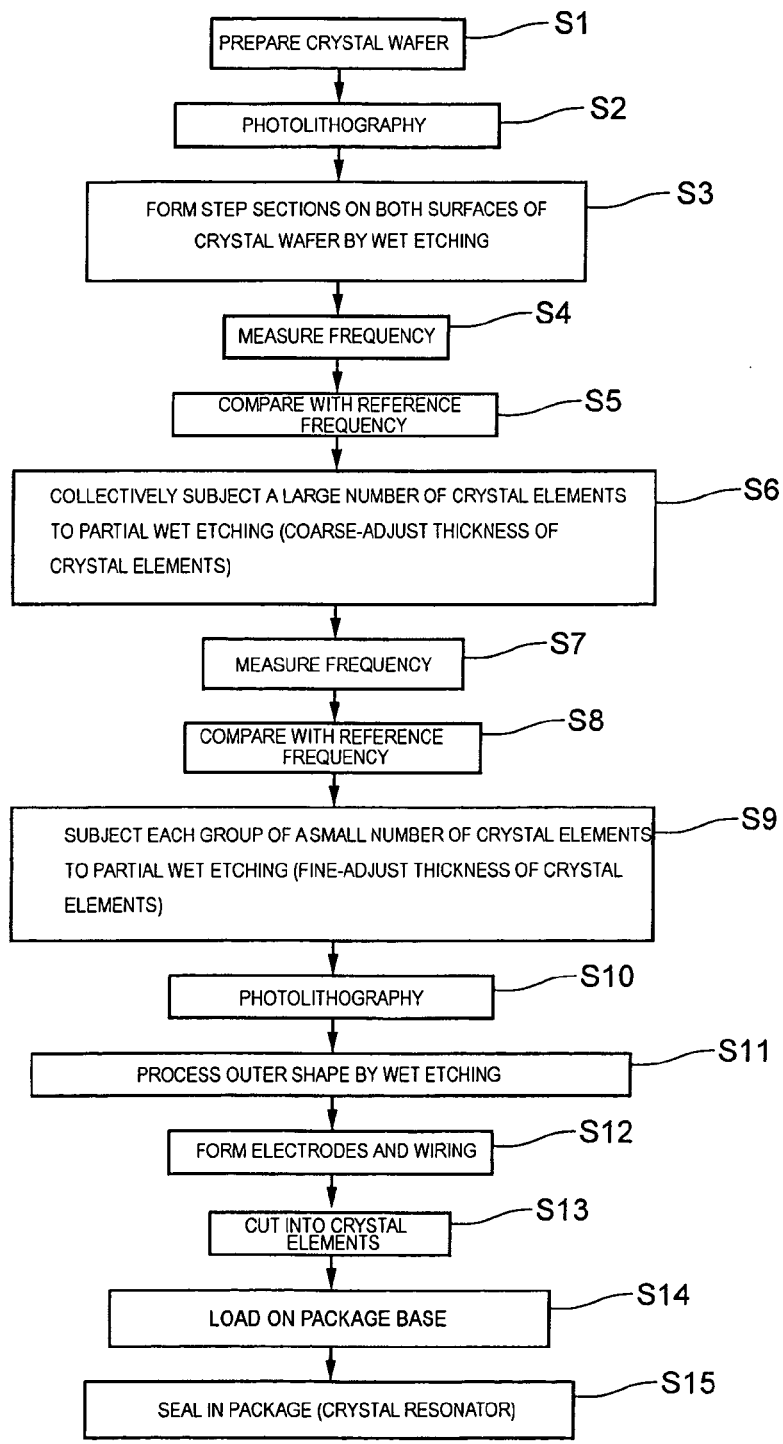
FIG. 3 is a flow chart of the crystal element manufacturing method of the present invention.
Figure 4:
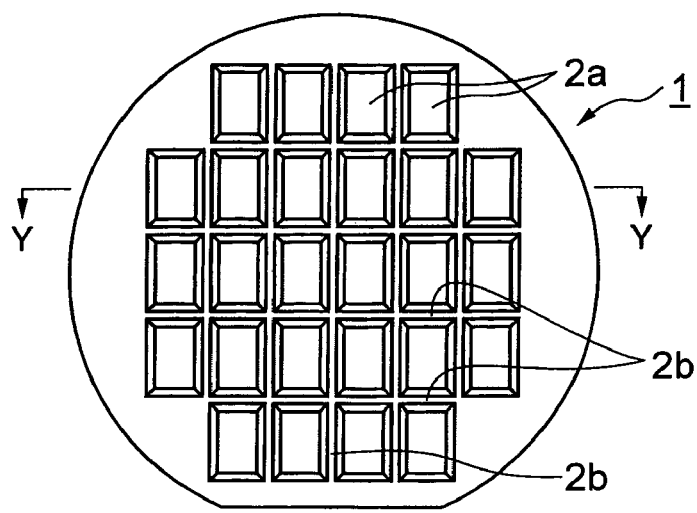
FIG. 4 is a plan view schematically showing crystal elements processed in a conventional crystal element manufacturing method, in which a large number of step sections are formed only on the front surface of a crystal wafer.
Figure 5:
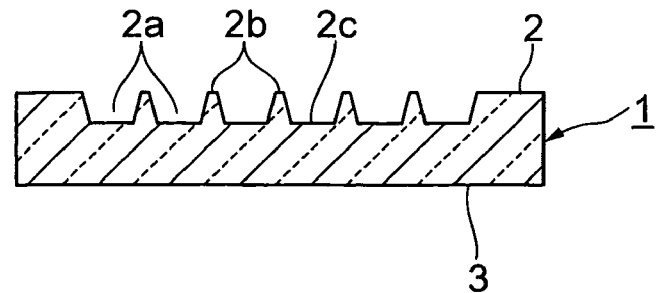
FIG. 5 is cross-sectional view of the crystal wafer shown in FIG. 4, taken along the arrows Y-Y.
Figure 6:
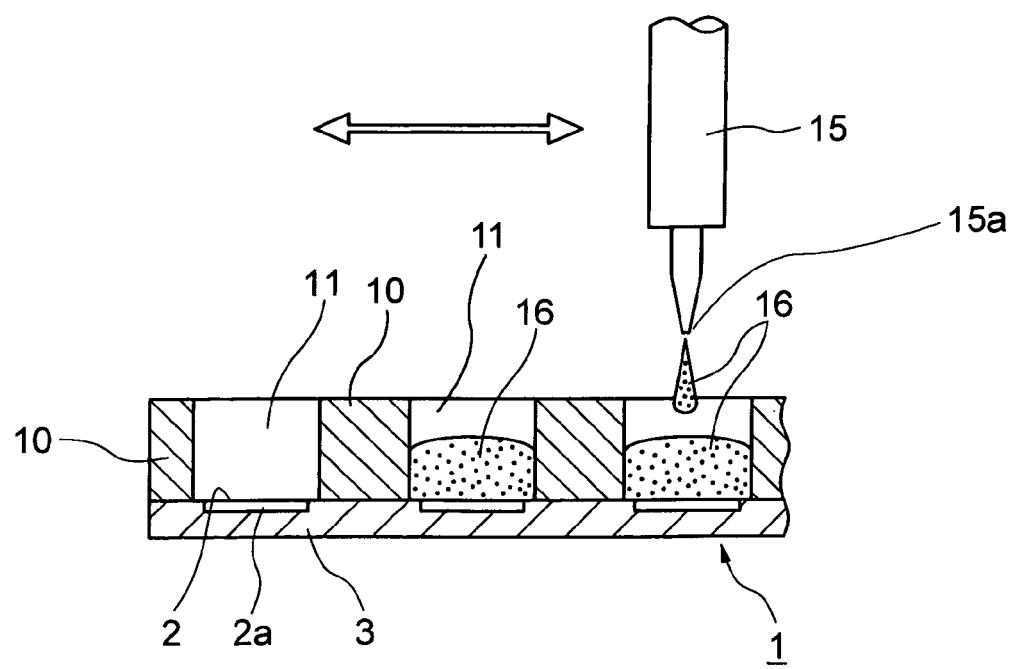
FIG. 6 is a schematic drawing of a wet etching section of a manufacturing apparatus used in the conventional crystal element manufacturing [method] shown in FIG. 4.

Here, the crystal wafer 1 shown in FIG. 1 and FIG. 2 is such that in the steps shown in FIG. 3, step sections (so-called reverse mesa sections) are formed by means of wet etching on both of the front and back surfaces of the crystal wafer 1, and the thicknesses of the crystal elements of the step sections of the crystal wafer 1 are fine-adjusted by means of partial wet etching, to thereby match the frequency thereof with a reference frequency.

Here, the term "partial wet etching" refers to an etching method in which, when etchant is dropped into the step sections from a syringe (nozzle), there are provided some places where the timing of dropping the etchant is shifted or the etchant is not dropped, and accordingly the etching amount of individual step sections is changed, thereby achieving a uniform thickness for each of the step sections within the wafer.

First, as illustrated in the crystal element manufacturing process of the present invention shown in FIG. 3, having prepared and cleaned the crystal wafer 1 having a predetermined dimension in step 1 (S1), in step 2 (S2), the shapes of step sections (crystal element formation sections) 2a and 3a (refer to FIG. 1 and FIG. 2), in which (for example, 1,000) crystal elements are to be formed, are patterned on both of the surfaces of the crystal wafer 1 by means of photolithography.

Next, in step 3 (S3), for example, as shown in FIG. 1A and FIG. 2, on the front surface 2 of the crystal wafer 1 with a thickness of 50 µm, there are formed, by means of wet etching with use of a hydrofluoric acid based etchant, for example, 1,000 square-shaped step sections (concaved sections) 2a, which will become crystal element formation sections, so as to respectively have a depth of 10 µm. At this time, the crystal wafer 1 to be wet-etched may be immersed in an etchant reservoir to thereby collectively form the step sections 2a. As a result of forming these step sections 2a, partitions 2b are formed between the respective step sections 2a, and consequently the etchant is prevented from flowing between the adjacent step sections 2a, allowing etching to be appropriately performed.

Meanwhile, as shown in FIG. 1B and FIG. 2, on the back surface 3 of the crystal wafer 1, there are formed step sections 3a that respectively have areas greater than that of the opposite step sections 2a formed on the front surface 2 of the crystal wafer 1 (corresponds to the combined areas of several of the step sections 2a). For example, there are formed step sections 3a with a depth of approximately 10 µm respectively having areas equivalent to the combined areas of four step sections 2a formed on the front surface 2. That is to say, the area of the step section 3a to be formed on the back surface 3 of the crystal wafer 1 is made several times greater than the area of the step section 2a to be oppositely-formed on the front surface 2 of the crystal wafer 1.

As a result of forming these step sections 3a, as with the front surface 2 of the crystal wafer 1, partitions 3b are formed between the respective step sections 3a on the back surface 3 of the crystal wafer 1, and consequently the etchant is prevented from flowing between the adjacent step sections 3a, allowing etching to be appropriately performed and the frequency adjustment to be achieved.

Furthermore, in steps 4 and 5 (S4 and S5) shown in FIG. 3, the frequencies of the crystal element formation sections within the respective step sections 2a are individually measured with use of a frequency measuring apparatus such as a probe, and compared with a reference (target) frequency, and deviation from the reference frequency is converted into a thickness of the crystal elements. Then, in step 6 (S6), in a plurality of the step sections 2a and 3a, for example the bottom sections 2c of the four step sections 2a are collectively subjected to partial etching, to thereby coarse-adjust the thickness of the crystal elements. At this time it is instead possible to only subject the step sections 3a that have an area greater than the area of the step sections 2a formed on the front surface 2 of the crystal wafer 1 to partial etching to be used for coarse-adjusting the thickness of the step sections (crystal element formation sections).

Moreover, in the coarse adjustment in the first stage, variations in the thicknesses of the step sections for which the frequencies are to be simultaneously adjusted in the fine adjustment in the second stage, may be adjusted by means of partial wet etching, so as to achieve an equal thickness, and then the thicknesses of the step sections of a large number of the crystal elements that belong to a group having an equal thickness (for example, ones that fall in a thickness deviation of 0.1 µm or less, depending on the size of the crystal wafer) may be collectively subjected to partial wet etching to thereby fine-adjust the frequency. This technique focuses on a point that after a crystal wafer has undergone a polishing process, step sections that are present in adjacent regions tend to have a substantially equal thickness or frequency.

Next, as with the above steps 4 and 5 (S4 and S5), in steps 7 and 8 (S7 and S8), the frequencies of the respective step sections are measured using the frequency measuring apparatus and compared with the reference frequency, and deviation therefrom is converted into a thickness of the crystal elements. Then, in step 9 (S9), for every one or small number of crystal elements, primarily the bottom sections 2c of the step sections 2a formed on the front surface of the crystal wafer 1 are subjected to partial etching, to thereby fine-adjust the thickness of the crystal elements.

With these two stages of frequency adjustment including the coarse adjustment and fine adjustment, the amount of operation time (tact) required in the step of partial wet etching crystal elements is significantly reduced.

Furthermore, after the thicknesses (frequencies) of the crystal elements have been fine-adjusted, the outer shape of a crystal resonator is patterned by means of photolithography in step 10 (S10), and in step 11 (11), the outer shape of the crystal resonator is formed by means of wet etching so that a supporting section (not shown in the drawing) of each of the crystal elements remains to connect to the crystal wafer 1. Then, the surrounding region of the respective crystal elements is punched out to complete the outer-shape processing. After that, electrodes, wiring, and the like are formed on the respective crystal element formation sections by means of vapor deposition, sputtering, or the like (step 12, S12). Furthermore, having completed the frequency adjustment, the supporting section that remained in the above step is removed and the crystal wafer 1 is divided into individual elements by means of dicing (step 13, S13), thereby forming the individual crystal elements 1.

Finally, the individual crystal elements are respectively housed in a package, and frequency adjustment is further performed on each individual element as necessary. Then, it is sealed to configure a crystal resonator. Moreover, in order to configure a crystal oscillator, an IC chip and the like in addition to the crystal resonator are housed within the package, and then it is sealed.

What is claimed is:

1. A crystal element manufacturing method for manufacturing a plurality of crystal elements at a crystal wafer level, the method comprising when the frequencies of a plurality of step sections formed on a crystal wafer are adjusted by adjusting the thickness of a crystal wafer that constitutes said crystal element in two stages by partial wet etching, variations in the thicknesses of a large number of said step sections are coarse-adjusted in a first stage by collectively subjecting the step sections to partial wet etching, and then variations in the thicknesses of each group of a small number of said step sections are fine-adjusted in a second stage by collectively subjecting the step sections to partial wet etching.

2. A crystal element manufacturing method according to claim 1, wherein an area of said step sections formed on said back surface of said crystal wafer is greater than an area of opposite step sections formed on said front surface.

3. A crystal element manufacturing method according to claim 2, wherein a size of a single step section with a greater area that is formed on said back surface of said crystal wafer or said crystal element includes a plurality of said opposite step sections with a smaller area formed on said front surface.

4. A crystal resonator that uses a crystal element manufactured by the manufacturing method according to claim 1.

5. A crystal oscillator that uses the crystal resonator according to claim 4.

6. A crystal element manufacturing method for manufacturing a plurality of crystal elements at a crystal wafer level, the method comprising when the frequencies of a plurality of step sections formed on a crystal wafer are adjusted by adjusting the thickness of the crystal wafer that constitutes said crystal elements in two stages by partial wet etching, variations in the thicknesses of a small number of said step sections are coarse-adjusted in a first stage by collectively subjecting the step sections to partial wet etching to achieve a substantially equal thickness, and then in a second stage, the thicknesses of a group of a large number of said step sections having substantially equal thicknesses are fine-adjusted by collectively subjecting the step sections to partial wet etching.

7. A crystal element manufacturing method according to claim 6, wherein an area of said step sections formed on said back surface of said crystal wafer is greater than an area of opposite step sections formed on said front surface.

8. A crystal element manufacturing method according to claim 7, wherein a size of a single step section with a greater area that is formed on said back surface of said'crystal wafer or said crystal element includes a plurality of said opposite step sections with a smaller area formed on said front surface.

9. A crystal resonator that uses a crystal element manufactured by the manufacturing method according to claim 6.

10. A crystal oscillator that uses the crystal resonator according to claim 9.

* * * * *